(12) United States Patent
Casey et al.

(10) Patent No.: US 7,078,259 B2
(45) Date of Patent: Jul. 18, 2006

(54) METHOD FOR INTEGRATING THERMISTOR

(75) Inventors: Jon A. Casey, Poughkeepsie, NY (US); William J. Ferrante, Hyde Park, NY (US); Edward W. Kiewra, Verbank, NY (US); Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 10/707,746

(22) Filed: Jan. 8, 2004

(65) Prior Publication Data

US 2005/0151213 A1    Jul. 14, 2005

(51) Int. Cl.
*H01L 21/00* (2006.01)

(52) U.S. Cl. .......................................... 438/54; 438/381
(58) Field of Classification Search ................ 438/381, 438/382, 48, 54, 55, 200, 210
See application file for complete search history.

(56) References Cited

U.S. PATENT DOCUMENTS

| | | | |
|---|---|---|---|
| 4,821,062 A | 4/1989 | Katoh et al. | |
| 5,847,436 A | 12/1998 | Iwata | |
| 5,975,485 A | 11/1999 | Tsai et al. | |
| 6,002,132 A * | 12/1999 | Mooney et al. | 250/338.4 |
| 6,191,420 B1 * | 2/2001 | Souma | 250/338.1 |
| 6,297,135 B1 * | 10/2001 | Talwar et al. | 438/592 |
| 6,329,262 B1 * | 12/2001 | Fukuda et al. | 438/385 |
| 6,388,296 B1 * | 5/2002 | Hsu | 257/377 |
| 6,717,147 B1 * | 4/2004 | Oda | 250/338.1 |
| 2005/0110108 A1 * | 5/2005 | Patel et al. | 257/453 |

\* cited by examiner

*Primary Examiner*—Tuan H. Nguyen
(74) *Attorney, Agent, or Firm*—Daryl K. Neff; H. Daniel Schnurmann (57) ABSTRACT

A structure and method are provided for forming a thermistor. Isolation structures are formed in a substrate including at least an upper layer of a single crystal semiconductor. A layer of salicide precursor is deposited over the isolation region and the upper layer. The salicide precursor is then reacted with the upper layer to form a salicide self-aligned to the upper layer. Finally, the unreacted portions of the salicide precursor are then removed while preserving a portion of the salicide precursor over the isolation region as a body of the thermistor. An alternative integrated circuit thermistor is formed from a region of thermistor material in an embossed region of an interlevel dielectric (ILD).

18 Claims, 12 Drawing Sheets

METHOD FOR INTEGRATING THERMISTOR

BACKGROUND OF INVENTION

This invention relates to a structure and method of fabricating a temperature sensitive conductive element, and more particularly to a structure and method of fabricating a thermistor for very large scale integrated (VLSI) circuits.

The successful miniaturization of integrated circuits (ICs) has been a primary enabler of fast evolving computer technology. Solid state processing techniques have also enabled a continual advancement in the miniaturization of electronic devices that are included in these ICs. In a miniaturized environment, however, careful monitoring of all physical factors is needed because even the slightest variation of these factors can detrimentally affect the performance of the IC. To enable careful monitoring, sensing devices also known as "sensors" have been developed and incorporated into most ICs. Sensors are themselves electronic devices that are designed selectively to measure wide varieties of physical quantities including force, acceleration, pressure, chemical concentration and temperature. The sensors are also miniaturized but most often they are fabricated on a size scale similar to that of current very large scale integration (VLSI) devices.

Temperature is one of the more important physical factors that need careful monitoring. External exposure to certain temperatures can harm devices, but also internal temperature variations can be symptomatic of other serious design or operational problems existing elsewhere in the IC. In miniaturized devices, temperature control becomes even more important because of the reduced size of the device that makes it more susceptible even to the slightest temperature variations.

In addition to the situations already enumerated, temperature sensing is especially useful in ICs using VLSI devices. Such circuits depend on temperature sensing for autonomic processor control. A locally monitored temperature excursion can trigger current reroute with the slightest temperature change outside the acceptable range before damage occurs such as in a particular transistor or circuit block. Similarly, integrated temperature sensor circuits could be used to locally and dynamically adjust supply voltages to particular transistors and circuit blocks to minimize the temperature differences across the chip and safe guard against such damage and to improve performance and timing. The performance of a particular transistor might be reduced by local adjustment of supply voltages. However, the overall chip or system performance and timing is optimized because transistors across the chip are better matched.

Consequently, temperature monitoring is extremely crucial and useful in the operation of a range of IC circuits. Temperature sensors have been introduced to address this need.

Temperature sensors, or temperature-sensing devices, are varied and include a range of devices such as thermocouples, reversed-biased diodes, and temperature-sensitive resistors. Each of these temperature-sensing devices has their advantages and their drawbacks and therefore is selectively used for different tasks to either maximize their benefits or minimize their drawbacks. For example, "thermistors", which are devices having a conductivity which varies with temperature, are advantageous for use in VLSI process schemes, particularly due to their simplicity of fabrication.

The effectiveness of a temperature sensor such as a thermistor is a direct function of its sensitivity. The greater the percentage of change in the conductivity of a sensor in relation to the change in temperature, the more sensitive is the sensor. Thermistors are growing in popularity due to their ease of process integration in the fabrication of ICs. In recent years there has been a continued effort to provide more sensitive thermistors. Nonetheless, the sensitivity of thermistor devices still has to be balanced with the ease of fabrication. This is especially true in thermistors that are used in conjunction with VLSI devices.

Use of thermistors in VLSI devices provides an additional advantage over the prior art sensors. In many ICs having VLSI devices, reversed-biased diodes, also known as thermal diodes, are utilized for their particular temperature sensitivity and their ease of integration into the VLSI fabrication process flow. However, recent studies have shown that when diodes are used, especially in silicon-on-insulator (SOI) or strained SOI substrates, the strained junctions cause noise and variability to the thermal diode measurement. Thermistors are then an attractive option to replace reversed-biased diodes in these circumstances. Nonetheless, any improvements to improve the temperature sensitivity of such thermistors while not affecting the ease of their fabrication process will make them even a more attractive option in such situations.

Consequently, it would be desirable to provide an integrated circuit thermistor structure.

It would further be desirable to provide an integrated circuit thermistor structure for use in conjunction with SOI and strained SOI structures in VLSI circuits.

It would further be desirable to provide methods for fabricating thermistors, which can be integrated into existing integrated circuit fabrication processes.

SUMMARY OF INVENTION

According to aspects of the invention, a structure and method are provided for forming a thermistor. Isolation structures are formed in a substrate including at least an upper layer of a single crystal semiconductor. A layer of salicide precursor is deposited over the isolation region and the upper layer. The salicide precursor is then reacted with the upper layer to form a salicide self-aligned to the upper layer. Finally, the unreacted portions of the salicide precursor are then removed while preserving a portion of the salicide precursor over the isolation region as a body of the thermistor.

According to another aspect of the invention, an alternative method is provided for forming an integrated circuit thermistor. In such method, an interlevel dielectric layer (ILD) is formed above a wiring level of an integrated circuit. An embossed area is then formed in the ILD. A thermistor material is deposited in the embossed area and over the ILD. The thermistor material is patterned and the ILD is etched selective to the patterned thermistor material to define openings in the ILD above the first wiring level, the thermistor material serving as a hardmask during the etching process. Subsequently, a second wiring level is formed in the etched openings in the ILD. Thermistor material is then removed from a surface of the ILD while permitting the thermistor material to remain in the embossed area. Finally, contacts are formed to the thermistor material.

DETAILED DESCRIPTION

The present invention introduces a new temperature sensing device and method for making such device. The device is a highly sensitive thermistor that is easy to fabricate and can be readily incorporated into all kinds of ICs. The thermistor of the present invention can even be readily used in ICs having VLSI devices and be integrated into SOI or SOI strained substrates, and is more immune to the problems of prior art sensors.

FIGS. 1–4 illustrate a first embodiment of the present invention. In this first embodiment of the invention, a thermistor is formed in a process also used to form a self-aligned silicide, that is, a "salicide".

Figure 1:
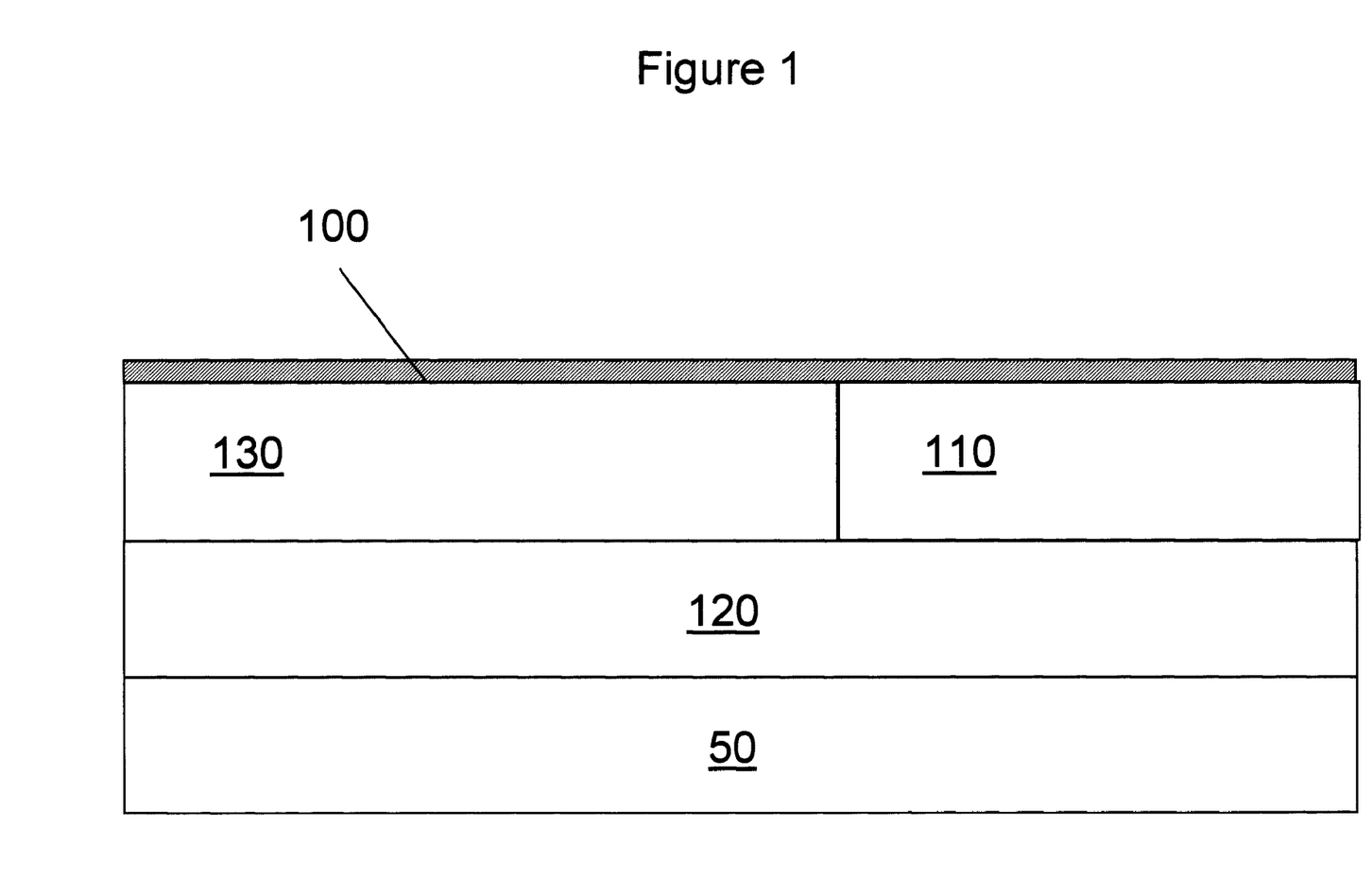
FIGS. 1 through 4 illustrate stages of processing according to an embodiment of the invention for fabricating a thermistor using a salicide process.

In FIG. 1, a cross-sectional view is provided of an initial fabrication stage using a semiconductor-on-insulator substrate such as a silicon-on-insulator (SOI) substrate. In recent years, silicon-on-insulator technology (SOI) has been gaining popularity as a way to improve transistor performance. The use of SOI substrates tends to decrease parasitic junction capacitance, leading to improvements in speed, reduced power consumption, better frequency response, and resistance to soft errors, while helping to address manufacturability concerns.

Many of the advantages provided by a SOI substrate stem from its structure. SOI substrates have a structure in which an active device layer of a single crystal semiconductor such as silicon is formed over an insulating layer of the substrate. The insulating layer acts to eliminate capacitance between devices formed in the active device layer and the lower bulk layer of the substrate, and to prevent the development of electrical paths through the substrate, which can ultimately degrade or destroy surface devices. The insulating layer is typically a layer of buried oxide (BOX) formed below the surface of a silicon wafer, formed by a process such as separation by implantation of oxygen (SIMOX). Alternatively, well-known bonding processes may also be used to form the SOI wafer.

In FIG. 1, the bulk silicon portion of the substrate is also shown at 50 and the BOX layer is shown at 120. The thin layer of Si remaining above this BOX layer 120 is shown at 110. The initial processing stage assumes that devices will have already been formed in the SOI layer 110. An upper portion of the thin Si layer 110 will be transformed into suicide for increased conductivity. In addition, to electrically isolate adjacent active areas formed on the substrate, shallow trenches isolation (STI) structure(s), as shown at 130, are formed on the BOX layer 120.

In order to form the layer of salicide on SOI layer 110, a thin layer 100 of conductive material, hereinafter referenced as a salicide precursor, is deposited over the thin SOI 110 and STI 130 structures. The thickness of the layer 100 of conductive material preferably ranges between about 5 nm to 100 nm.

It should be noted that the salicide precursor would be ultimately used to form the thermistor during subsequent processing stages. Therefore, the selection of the salicide precursor material is important, as it may affect the sensitivity, and thus the effectiveness, of the thermistor. Although a variety of metals may be used to form the thermistor, it is determined that certain substances provide more effective temperature-sensing functions. The most common figure of merit in determining the effectiveness of a thermistor is resistance temperature coefficient (RTC). The RTC is defined as the percentage change in resistance for a one degree Celsius temperature change. While the RTC may be positive or negative, the absolute value of the RTC is indicative of the device's sensitivity. The higher the magnitude of the RTC, the more sensitive the thermistor is.

The following table provides the RTC values for some common thermistor materials. Some of these materials are also shown to be effective candidates in the fabrication process for VLSI devices because of their device integration characteristics.

TABLE 1

| RTC OF THERMISTOR MATERIALS | |
| --- | --- |
| Thermistor Material | RTC |
| Platinum (Pt) | +0.3927%/C |
| Copper (Cu) | +0.68%/C |
| Cobalt (Co) | +0.604%/C |
| Nickel (Ni) | +0.69%/C |
| Silicon (Si - intrinsic) | +0.70%/C |
| SiC (Silicon Carbide) | −2.01%/C |
| Boron doped SiC | −2.85%/C |

Materials such as silicon carbide (SiC) and especially boron doped SiC, show great promise for use as thermistors, due to the large magnitude of their RTCs. SiC thin film thermistors are superior to conventional ceramic thermistors and have been fabricated through radio frequency (RF) sputtered techniques for high reliability, high accuracy and ease of manufacturing. Thermistors made of a thin layer of SIC film are also considered advantageous due to low power dissipation factors of such discrete devices.

In addition to SiC, elemental materials or their associated suicides or other conductive materials may be readily integrated as thermistor materials of VLSI devices. Some examples of materials that are used as salicide precursors are Pt, Cu, Co, Ni, which are all provided in Table 1, and other metals such as Tungsten (W), or Titanium (Ti), that are not shown in Table 1. Some examples of the salicides of such elemental materials are $CoSi_x$, $NiSi_x$ and $PtSi_x$. It should be understood that these examples are only provided for illustrative purposes and other elemental materials, or other materials having suitable improved RTCs can be among the materials selected for fabricating a thermistor.

In another embodiment of the present invention, the conductive layer (salicide precursor layer) 100 may consist of a stack of one or more metal and/or metal compound layers. For example, a barrier/adhesion layer can be formed on top of the original metal or metal compound layer consisting of substances such as titanium nitride (TiN) or tantalum nitride (TaN) to facilitate later processes.

A variety of methods can be used to deposit the salicide precursor. The salicide precursor may be deposited using any one of several conventional thin-film deposition techniques. These include chemical vapor deposition (CVD) processes (especially for depositing tungsten), physical vapor deposition (PVD) techniques, and sputtering, among others.

Figure 2:
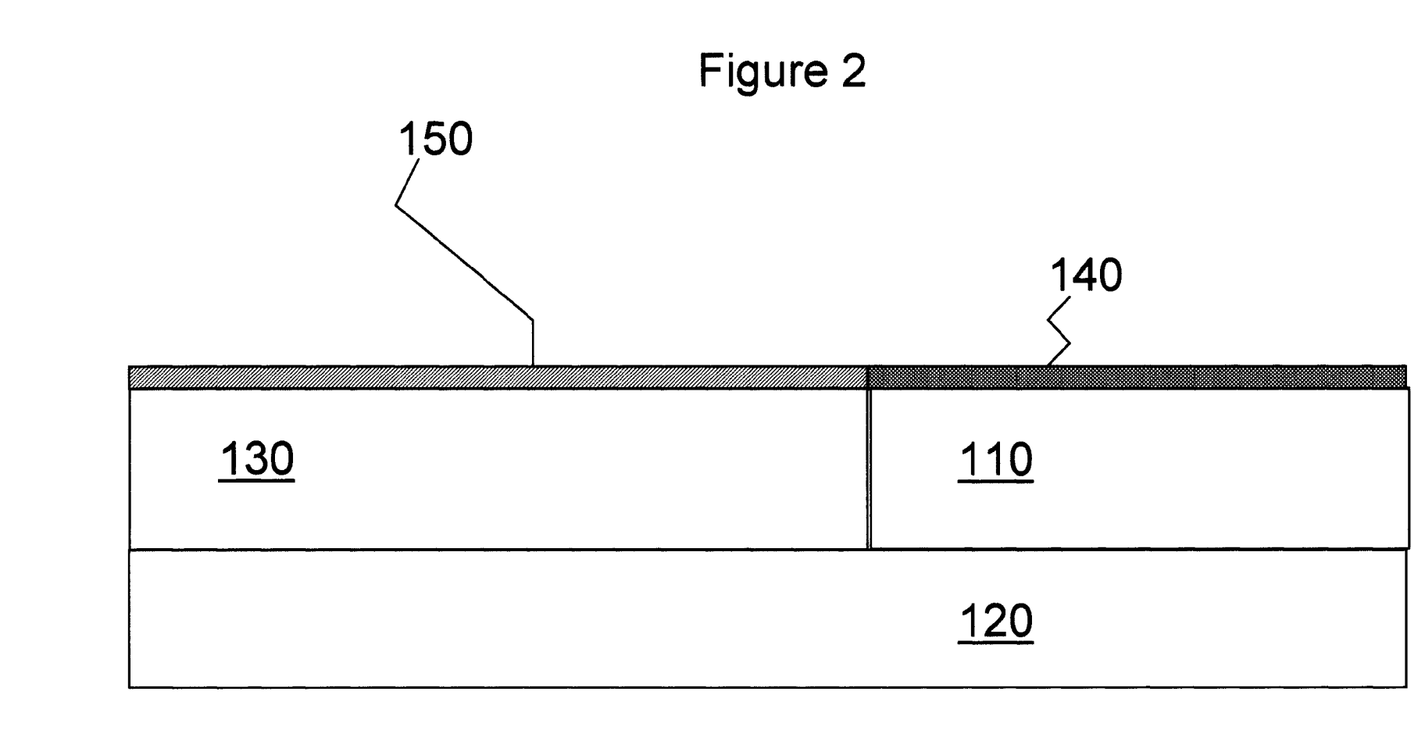

FIG. 2 illustrates a subsequent processing stage. FIG. 2 is a cross-sectional depiction of the silicon layer 110 and salicide precursor 100 after further processing is conducted so that a layer of silicide or salicide is formed, as shown at 140 over the silicon 110. Again, a variety of processes are available to cause silicidation. In a preferred embodiment, a thermal reaction is provided on the conductive or salicide precursor layer 100 to cause silicidation. Silicidation occurs only on the silicon layer. Therefore, after the thermal reaction, a layer of silicide 140 is formed only on the silicon layer 110. The conductive layer remains un-reacted on the STI 130 region where there is no silicon present. To better distinguish between the un-reacted conductive layer remaining after the thermal reaction and the conductive layer acting as the salicide precursor, even though in essence the two layers are the same, the un-reacted conductive layer will be hereinafter referenced at 150.

Figure 3:
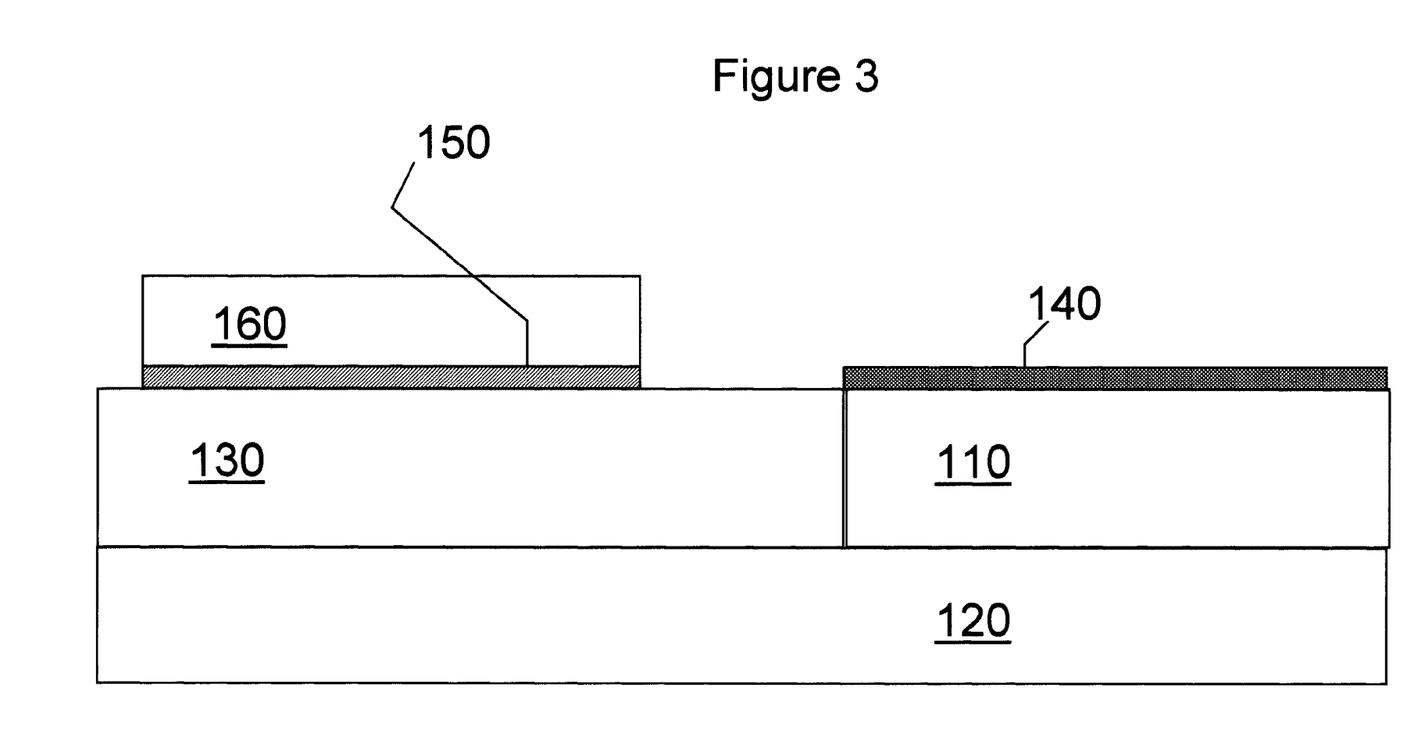

FIG. 3 illustrates a subsequent processing stage. In the cross-sectional view of FIG. 3, a block mask layer 160 is shown as patterned over the un-reacted conductive layer 150. With the block mask 160 in place, the unreacted conductive layer 150 is patterned by etching such as, but not limited to, vertical etching. Some examples of such a vertical etch are a reactive ion etch (RIE), and an isotropic etch, either of which must be selective to the silicide of layer 140 and the block mask material. In a preferred embodiment, an anisotropic wet etch is used for such removal. Other etching methods that can be used include chemical dry etching, ion milling or other similar methods. In the embodiment illustrated in FIG. 3 in which the salicide 140 is not protected by the block mask 160, the etch must be selective to the salicide and the block mask material.

The etching process is then followed by the removal of the entire block mask through conventional methods. Post clean-up procedures can be also conducted if desired or needed. The remaining unreacted metal layer 150 has now been patterned as the body of a thermistor, and is hereinafter referred to as thermistor 170, as shown in FIG. 4.

In an alternative embodiment (not shown), the block mask 160 is patterned to cover both the area of the unreacted conductive layer 150 and the salicided areas 140. In such case, etching of layer 150 can be performed by an etch which need not be selective to the salicide material.

Figure 4:
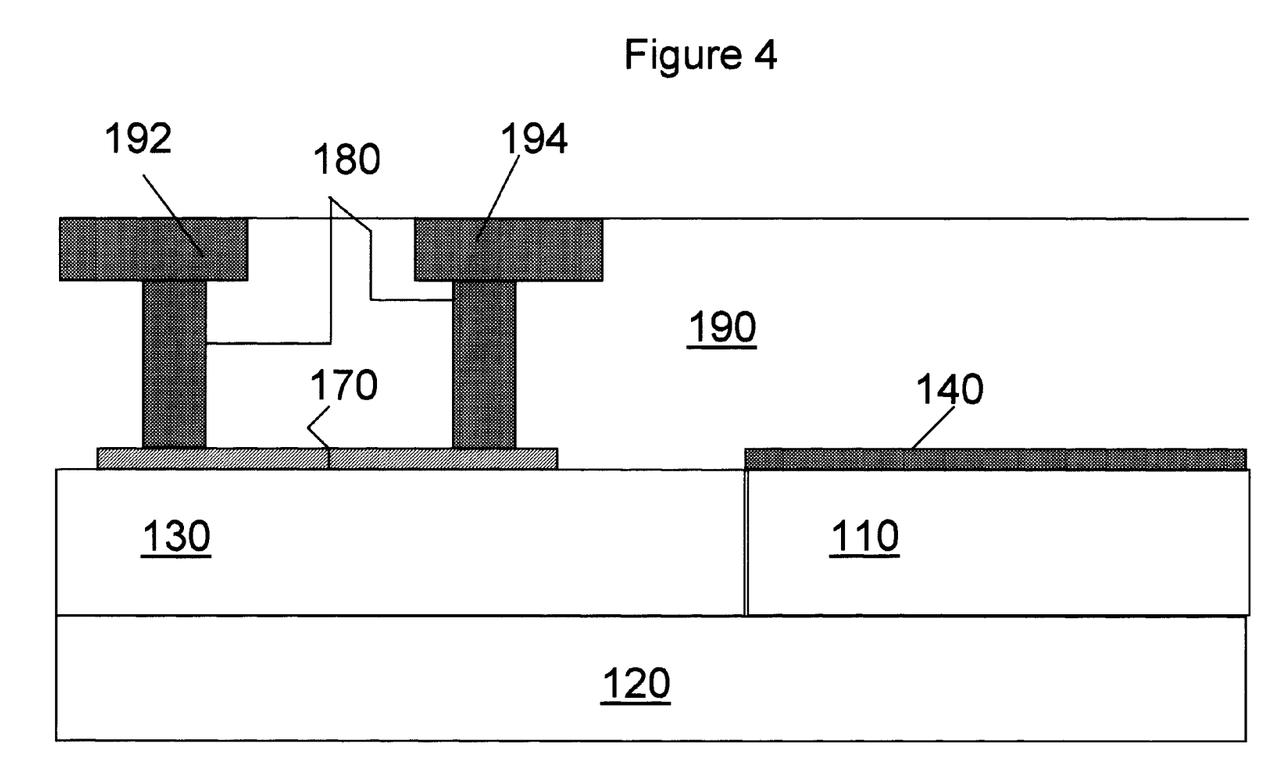

A subsequent processing stage, as illustrated in FIG. 4, provides for the deposition of an interlevel dielectric layer (ILD), as shown at 190. The ILD can be made from a variety of materials such as those used conventionally. Furthermore, the ILD can be comprised of deposition of a plurality of levels, forming an ILD stack. In a preferred embodiment, however, borophosphosilicate glass (BPSG) is used as the ILD 190. If multiple layers of interlevel dielectrics are used, the BPSG is preferably a first layer of such dielectric stack. One advantage of using BPSG is that it provides a uniform and well formed coverage, leaving no holes and filling the small gaps so that the ILD 190 provides superior adhesion to all surfaces. It should be noted that the ILD 190 is blanket deposited over both the STI region 130 (including its overlaying thermistor 170) as well as the salicide layer 140. According to a particular embodiment of the invention, following deposition, the ILD 190 is planarized. Any conventional planarization method can be used to planarize the structure in such instance, for example, such as by a chemical mechanical polishing (CMP) method.

Contact vias, as illustratively shown at 180, can then be created by patterning the ILD 190 using conventional methods, so as to form thermistor contacts. In a preferred embodiment, conductive patterns 192, 194 may also be formed at the same time by patterning grooves in the ILD 190 that extend horizontally as wiring patterns, or alternatively, to provide landing surfaces to which subsequently higher level conductive vias (not shown) are interconnected. As horizontal wiring patterns, the conductive patterns 192, 194 extend in transverse directions, e.g., pattern 192 may extend in an up-down direction over the substrate and pattern 192 may extend in a left-right direction over the substrate.

In a particular embodiment, the contact vias 180 and conductive patterns 192, 194 are formed by patterning the interlevel dielectric layer 190 by conventional damascene techniques. Alternatives for forming conductive patterns for interconnection to the vias 180 include patterning of a deposited conductive layer over ILD 190, as by a reactive ion etch process.

In a particular embodiment of the invention, the thermistor 170 can serve as a local interconnect between the same-level conductive patterns 192, 194 that are coupled to the respective vias 180. In another embodiment, the thermistor locally interconnects conductive patterns at different wiring levels. For example, the thermistor locally interconnects patterns 192 and 194, but pattern 194 functions as a land for providing further interconnection to a wiring level higher than the conductive patterns 192, 194 shown in FIG. 4.

In such case, the thermistor provides a local interconnect function either instead of, or in addition to a temperature-sensing function. In this context as a local interconnect, the term "thermistor" is applied broadly to the structure achieved and does not require the thermistor 170 to be used for a temperature-sensing function.

Another embodiment of the invention is illustrated in FIGS. 5 through 12. In this embodiment, a thermistor is formed from a patterned portion of a hard mask layer that is also used to pattern an interlevel dielectric layer. Hard-mask materials are varied but may include organic polymeric materials such as various anti-reflective coatings (ARCs) used in semiconductor processing, inorganic materials such as silicon oxides, silicon nitrides, silicon oxynitrides and SiC, or any metallic or semi-conducting material in an amorphous, poly-crystalline, or single-crystal form.

Figure 5:
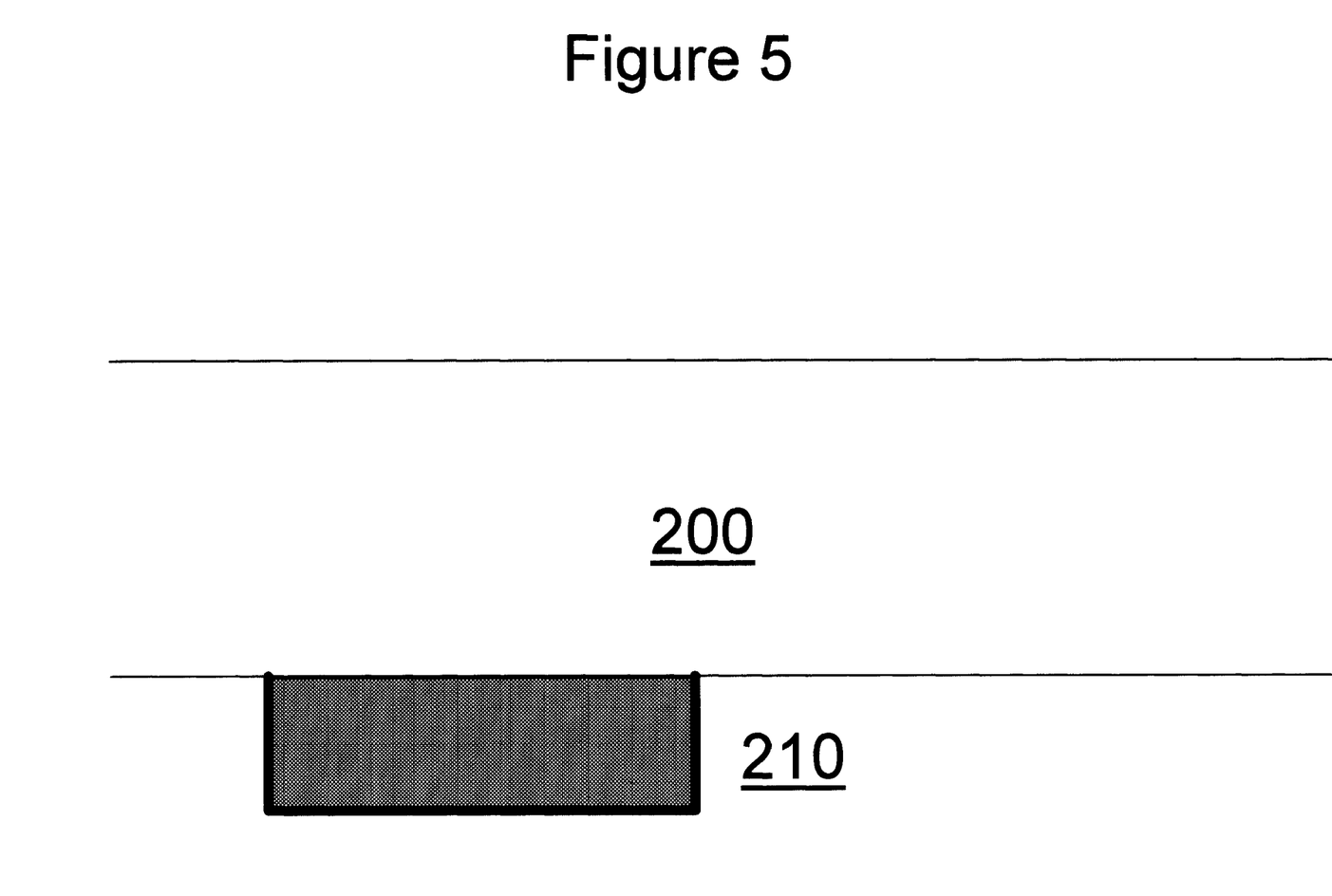
FIGS. 5 through 12 illustrate stages of processing according to another embodiment of fabricating a temperature-sensitive resistor using an integrated hard mask to form a thermistor at a wiring level above the surface of a substrate.

FIG. 5 illustrates an initial stage in the fabrication of a thermistor according to a second embodiment of the invention. FIG. 5 is a cross-sectional view of a wiring level 210 formed below an interlevel dielectric layer (ILD) 200. The wiring is provided illustratively and can represent wiring for a variety of functions such as interconnect wiring and bitline wiring. The ILD 200 is formed over the wiring level 210.

Figure 6:
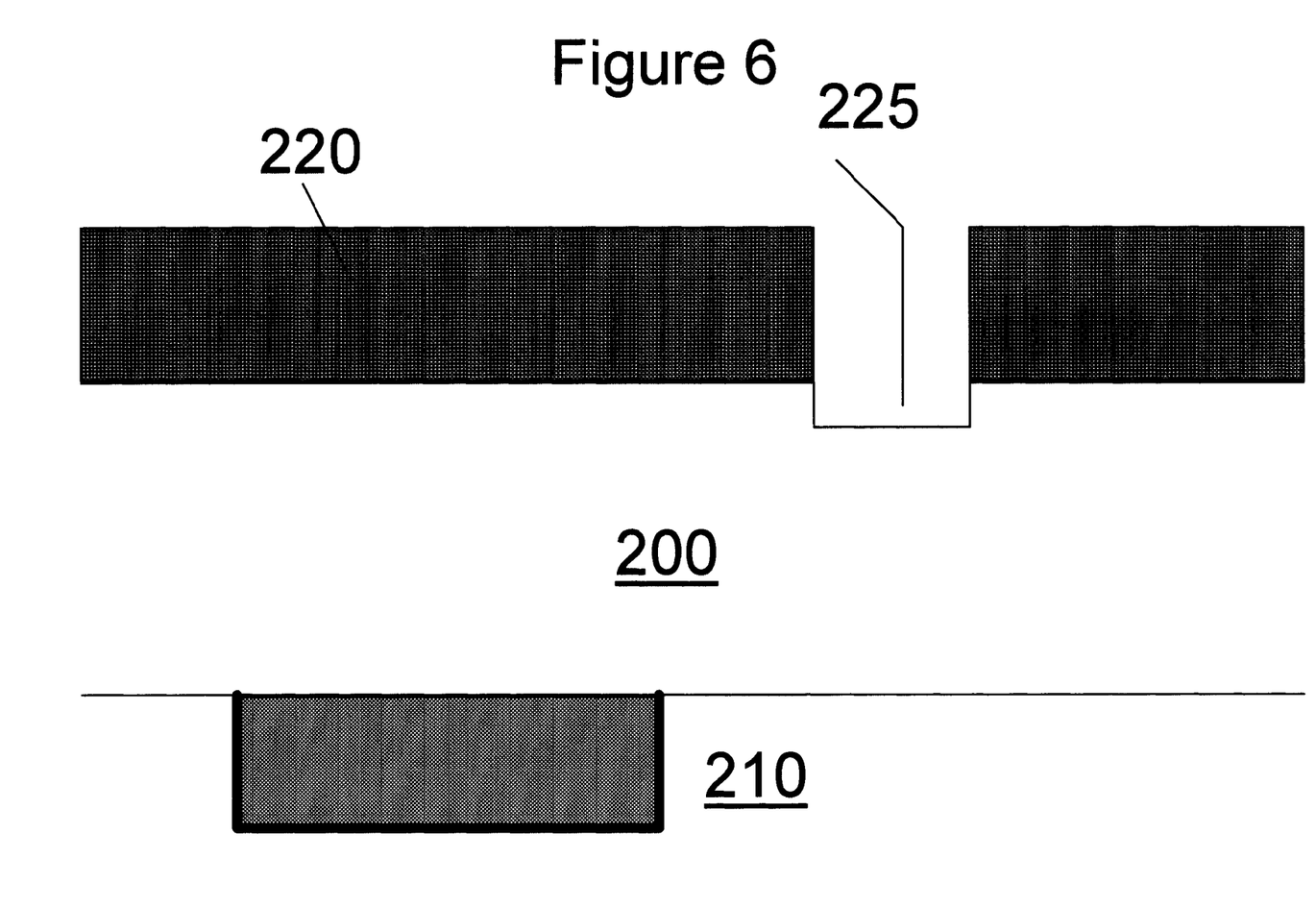

FIG. 6 illustrates a subsequent stage of processing. As shown in FIG. 6, a mask layer 220, preferably consisting of a photoresist material, is deposited over the interlevel dielectric layer 200 and then patterned. The ILD 200 is then etched according to the mask layer 220 by a wet etch or anisotropic RIE. An embossed region 225 then results. The mask layer 220 is then removed.

Figure 7:
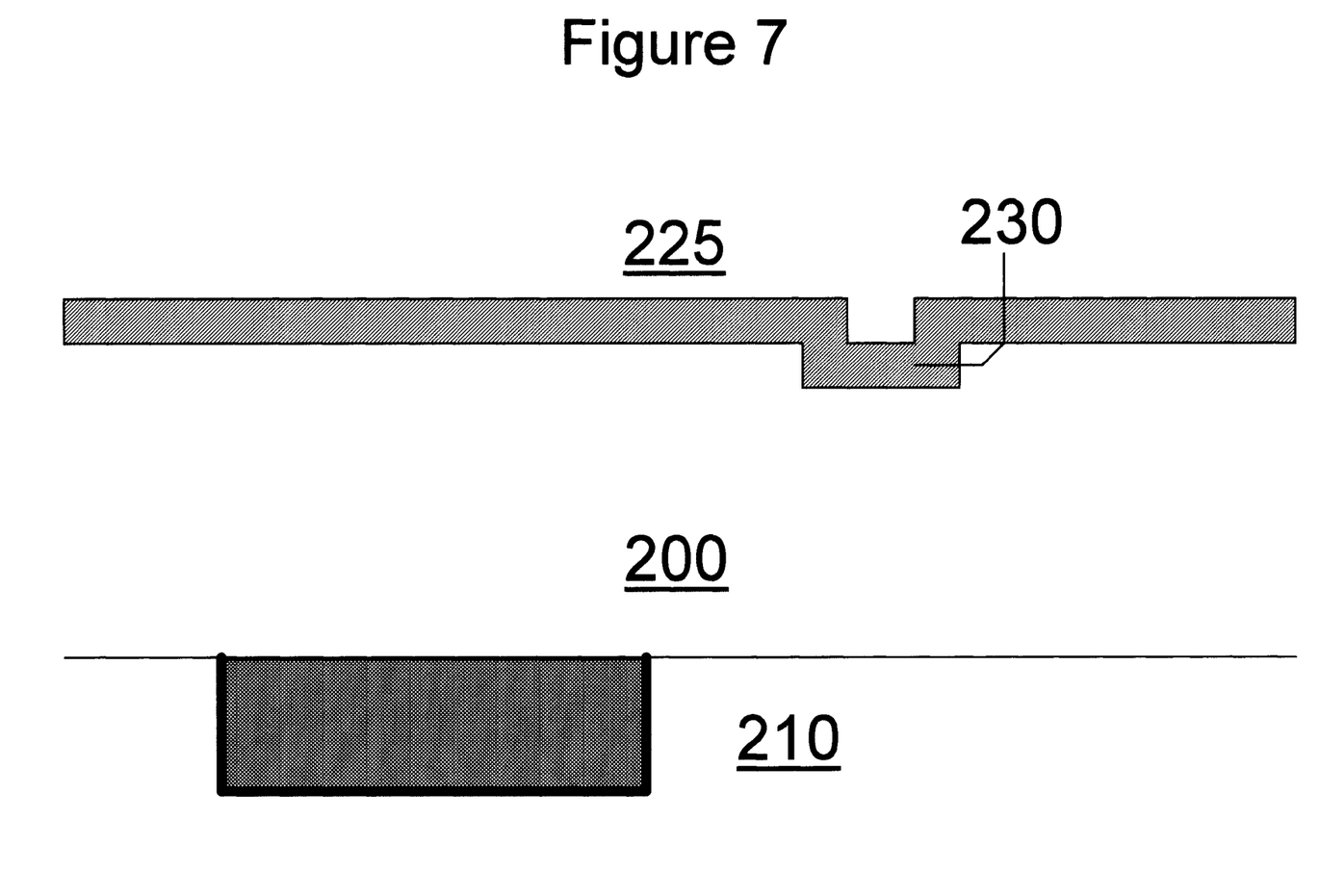

FIG. 7 illustrates a subsequent stage of processing. As shown in FIG. 7, a layer of material 230 is deposited over the ILD 200 as a hard mask for subsequent patterning of the ILD 200 and the thermistor. The material of the hardmask layer preferably has a conformal characteristic such that it covers surfaces to a relatively even thickness.

Figure 8:
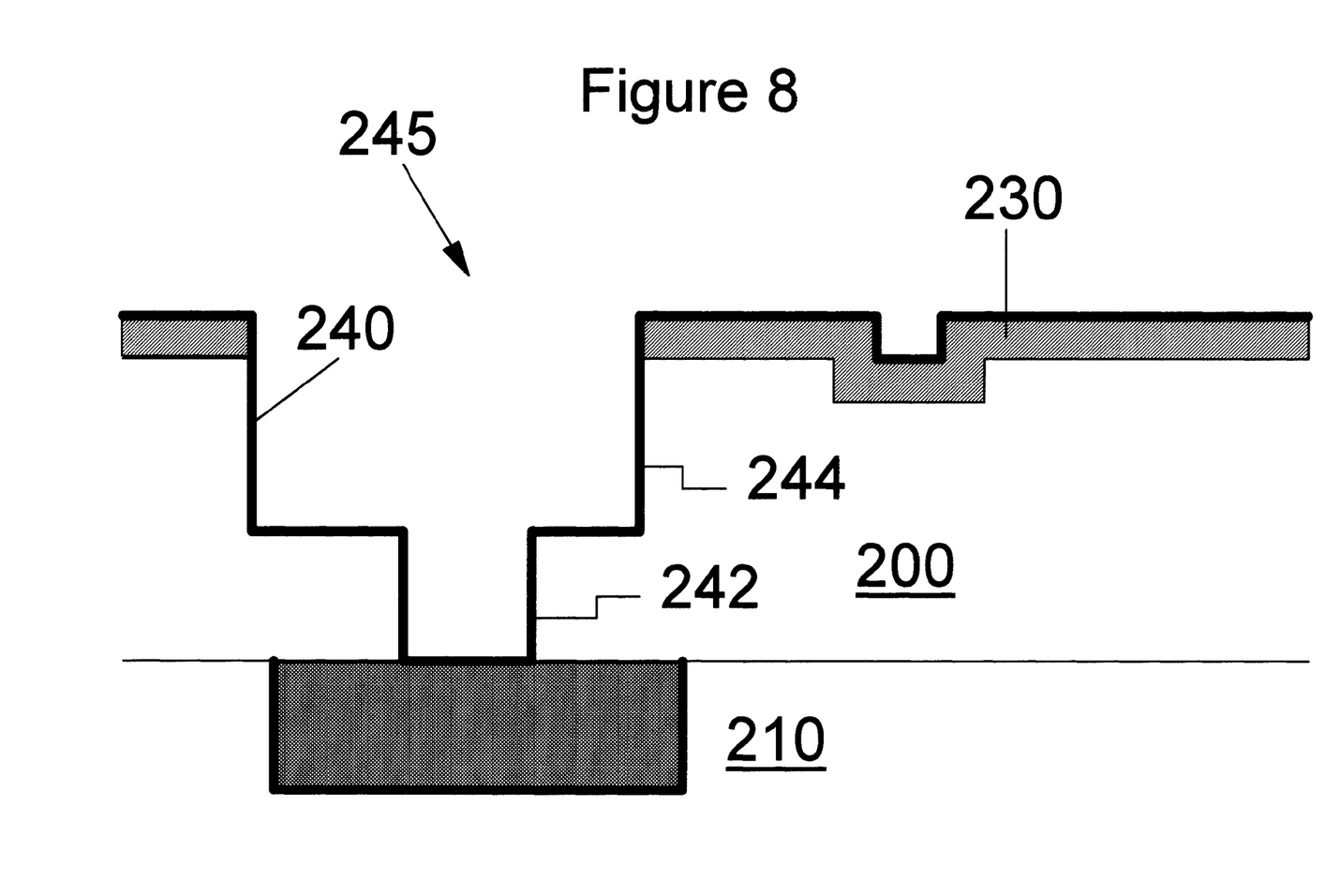

FIG. 8 illustrates a subsequent processing stage. In the cross-sectional illustration of FIG. 8, dual-damascene patterning is performed to the ILD 200, among other processes. By damascene processing, a patterned layer is imbedded on and in another layer such that the top surfaces of the two layers are coplanar. In semiconductor manufacturing, damascene process includes the creation of grooves and holes in appropriate locations. The grooves are formed in an insulating material, such as an interlevel dielectric layer. The grooves and holes may be created though a variety of techniques including etching, which are then filled with a conductive material such as a metal.

Applying this concept to FIG. 8, the dual damascene process when conducted creates an opening 245. In a preferred embodiment as illustrated in FIG. 8, the opening 245 is shaped so it includes an upper area 244, typically extending in a direction from left to right across the page or in a transverse direction into and out of the page. The upper area 244 typically extends in a horizontal direction further than a lower area 242. The lower area 242 typically is provided as an essentially vertical via.

Figure 9:
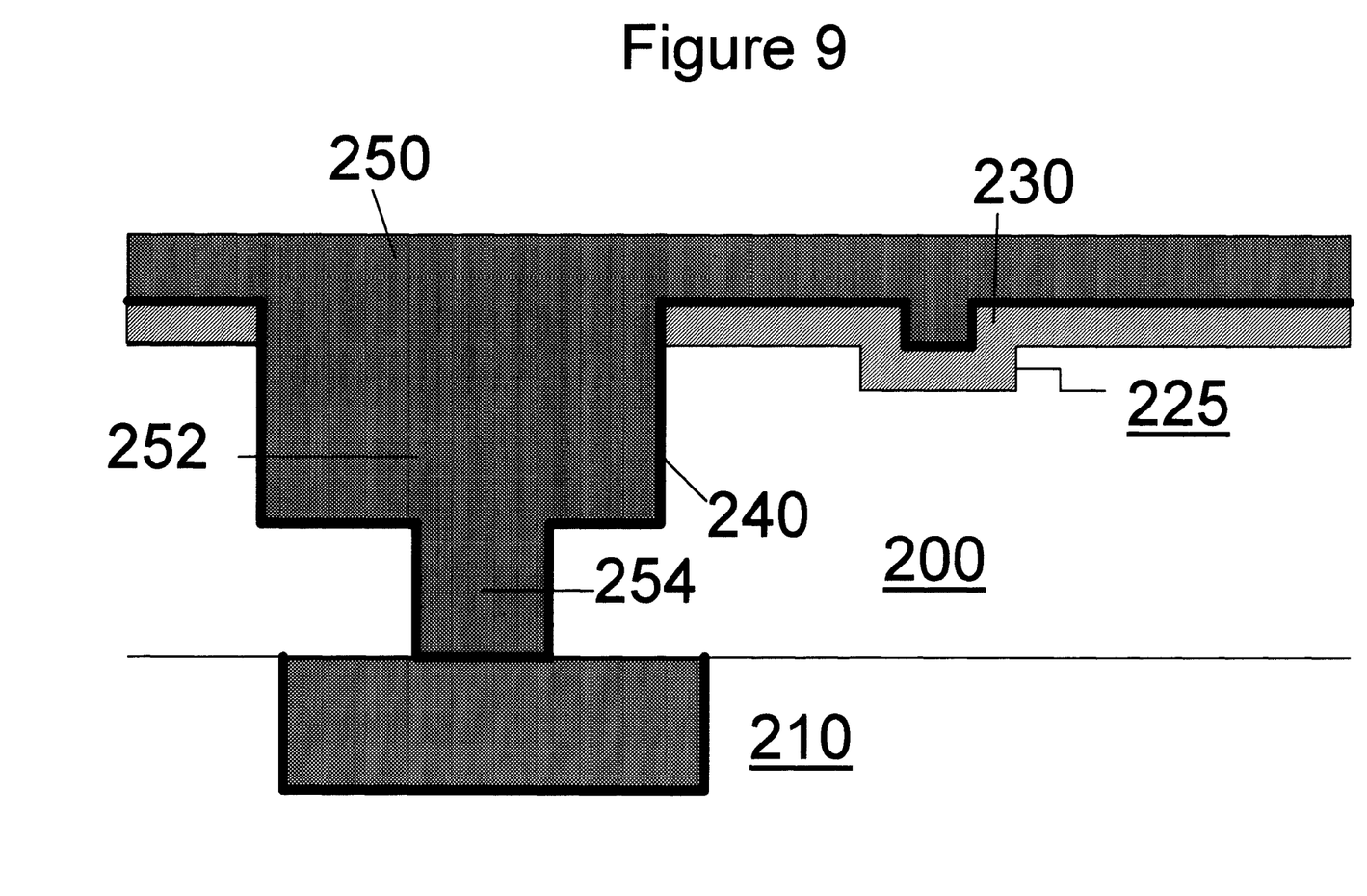
Figure 10:
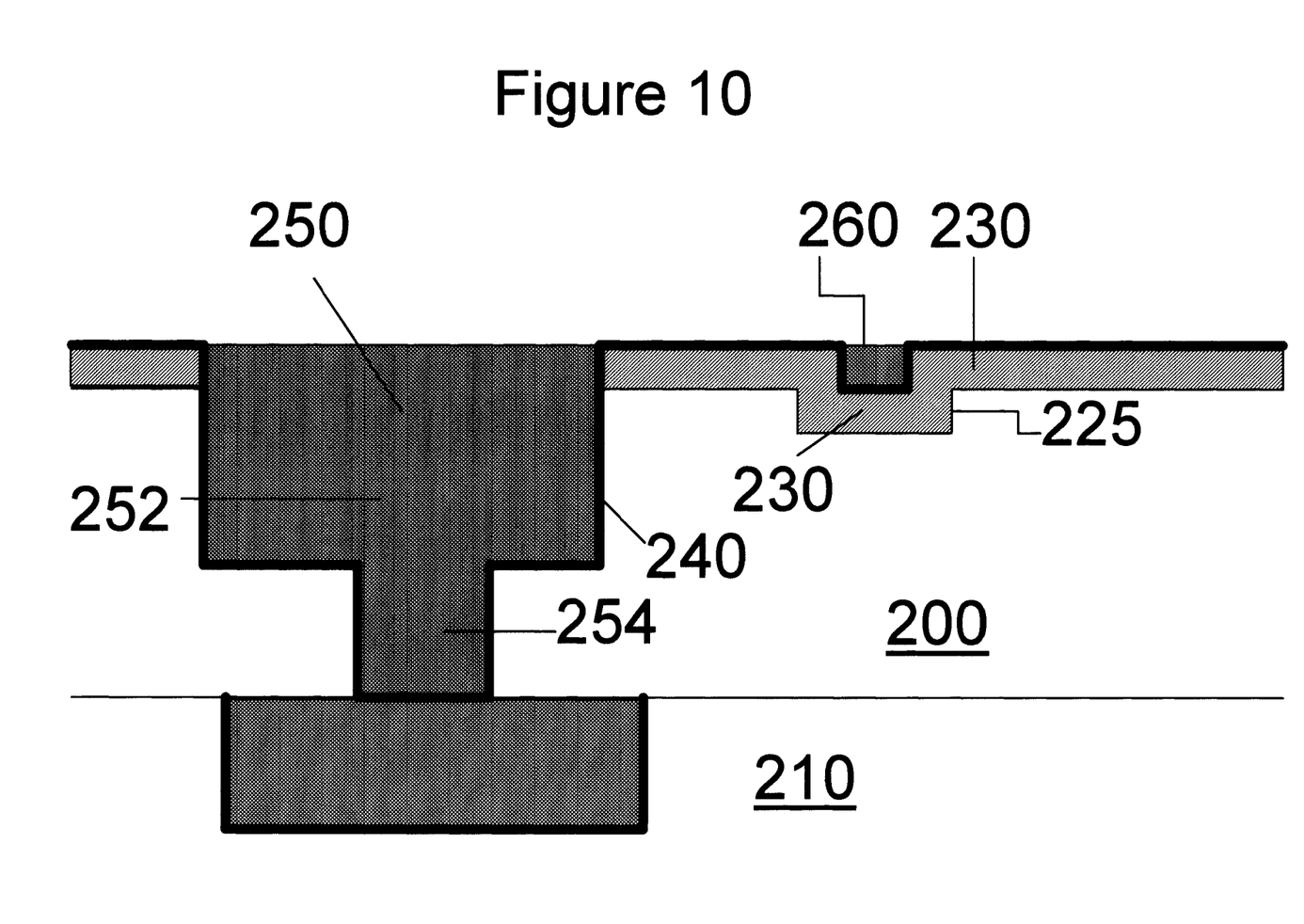
Figure 11:
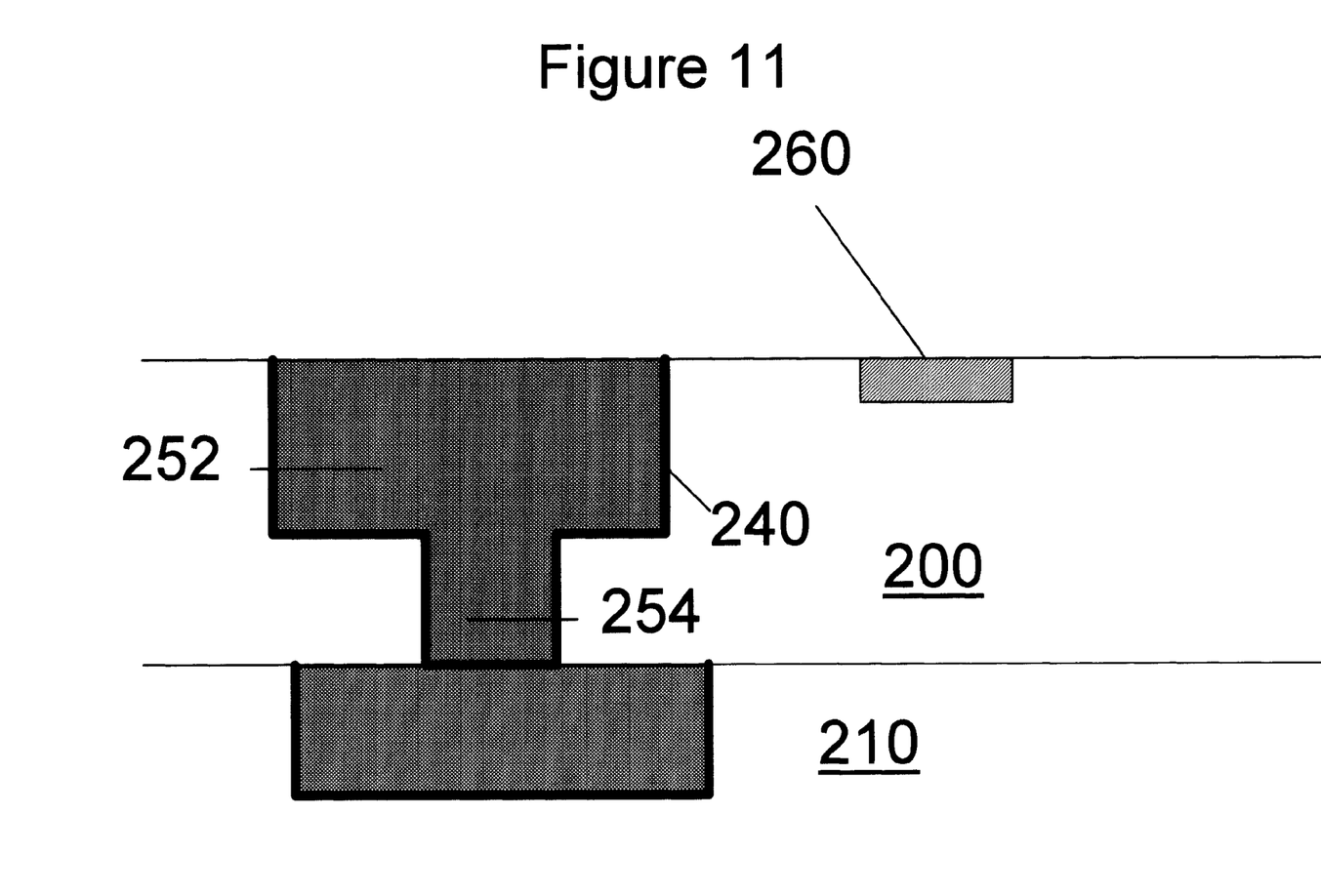

Thereafter, a conductive liner 240, referred to as an interconnect liner is provided as shown at 240 in FIG. 8. Note that the interconnect liner 240 is provided in a manner to contact wire level 210. Continuing the process, the lined opening 245, as lined by liner 240, is filled by a conductor such as a metal, as shown in FIG. 9. The conductor material 250 is blanket deposited or plated over the substrate to fill opening 245 and to adhere to the surface of the thermistor material 230 over the embossed region 225. The conductor layer 250 forms a back-end-of-the-line (BEOL) interconnect. The structure is then planarized though conventional planarization methods such as a chemical mechanical polishing (CMP) method, stopping on the liner 240, as shown in FIG. 10. The hard mask layer 230 is then also further polished to the top of ILD 200, so that it only remains in the embossed area 225. The hard mask material filling in the embossed area 225, will hereinafter be referred to as 260, as shown in FIG. 11. At the conclusion of this stage of processing, a conductive via 254 contacts the wiring level 210, as well as a second wiring level 252.

Figure 12:
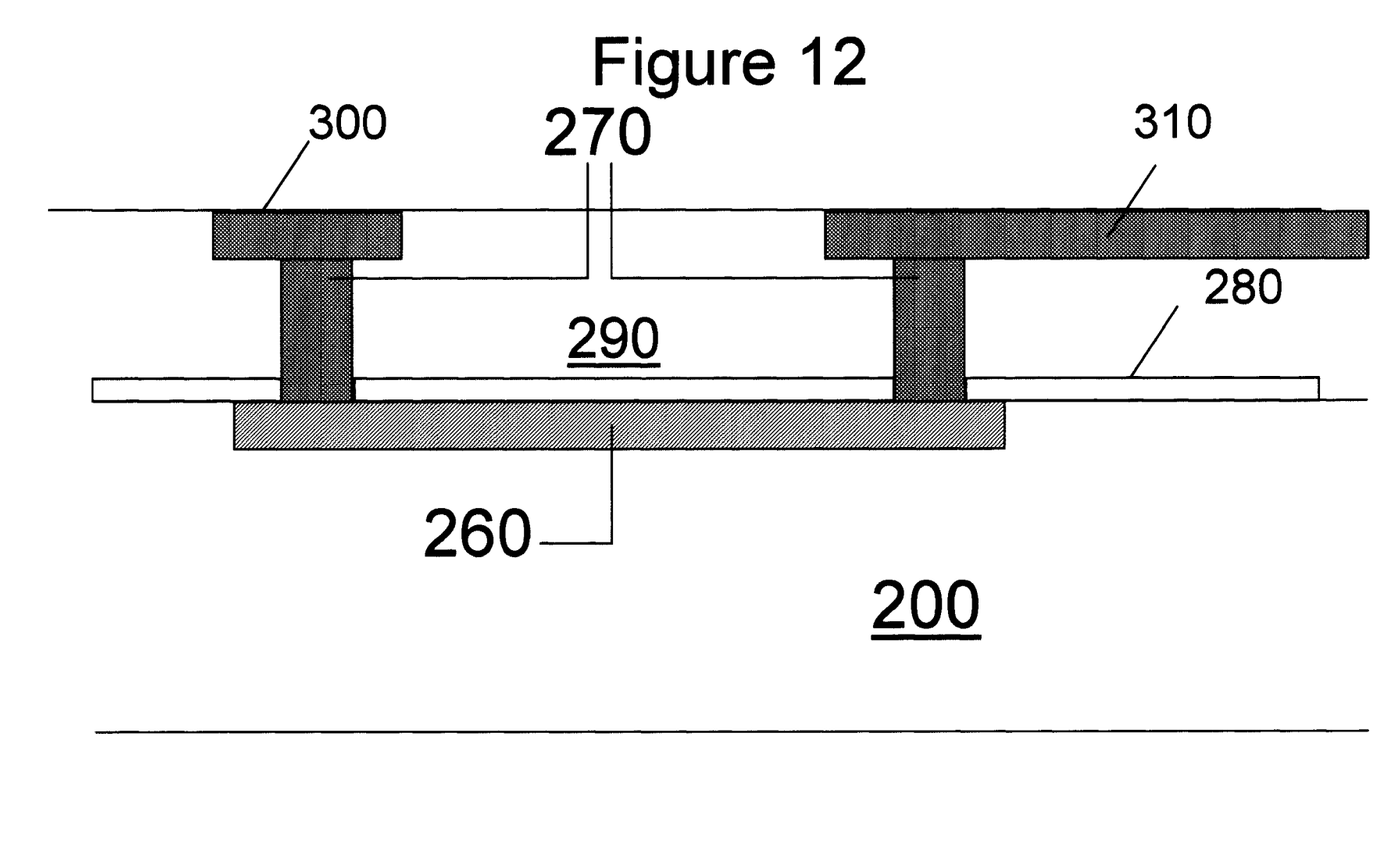

The hardmask material 260 in the embossed area is then used to form a thermistor, as shown in FIG. 12. Preferably, a capping layer 280 is formed on the hardmask material 260 prior to forming contact vias 270. The capping layer 280 is preferably an easily patterned dielectric layer such as a layer of deposited silicon nitride or deposited silicon dioxide. Thereafter, another interlevel dielectric layer (ILD) 290 is deposited, preferably followed by planarization. Via openings are then patterned in the ILD 290. Once the via openings have been etched, contact vias 270 are formed by depositing a conductive material such as a metal in the openings. In a preferred embodiment, conductive patterns 300 and 310 are also formed by patterning horizontally oriented patterns in the ILD 290, and then depositing the conductive material to simultaneously form the contact vias 270 and the conductive patterns.

As in the above-described embodiment, the thermistor 260 may serve as a local interconnect between conductive patterns 300 and 310 which are coupled to respective ones of the vias 270.

According an embodiment of the invention, an integrated circuit thermistor structure is provided. According to a particular embodiment of the invention, an integrated circuit thermistor is fabricated by a process also used to form a salicide. According to another particular embodiment, a thermistor is fabricated by a process also used to form wiring of an integrated circuit such as back-end-of-line (BEOL) wiring.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of forming a thermistor, comprising:
    forming an isolation region in a substrate including at least an upper layer of single crystal semiconductor;
    depositing a salicide precursor over said isolation region and said upper layer of single crystal semiconductor;
    reacting said salicide precursor with said upper layer to form a salicide self-aligned to said upper layer, said salicide precursor not reacting to form a salicide with said isolation region; and
    removing a portion of said unreacted salicide precursor while preserving a portion of said unreacted salicide precursor over said isolation region as a body of said thermistor.

2. The method of claim 1 further comprising:
    forming a layer of interlevel dielectric (ILD) over said body of said thermistor; and
    forming conductive contacts to said body of said thermistor insulated by said ILD.

3. The method of claim 2 wherein said interlevel dielectric includes borophosphosilicate glass (BPSG).

4. The method of claim 2 further comprising interconnecting first and second conductive patterns to respective ones of said contacts such that said thermistor provides local interconnection between said first and second conductive patterns.

5. The method of claim 1, wherein said salicide precursor consists essentially of at least one metal selected from the group consisting of: Pt, Cu, Co, Ni, W, Ti.

6. The method of claim 5, wherein said body of said thermistor has a thickness between 5 and 100 nm.

7. The method of claim 5 wherein said single-crystal semiconductor consists essentially of silicon and said substrate is a silicon-on-insulator substrate having a buried oxide layer between said upper layer of single-crystal silicon and a bulk layer of single-crystal silicon.

8. The method of claim 7, wherein said isolation region is a trench isolation region.

9. The method of claim 5, wherein said salicide precursor is removed in a manner such that said thermistor body only overlies an isolation region.

10. The method of claim 9, wherein said isolation region is a trench isolation region.

11. The method of claim 5, wherein said salicide precursor is deposited over said isolation region and said upper layer of single crystal semiconductor by sputtering.

12. The method of claim 1, wherein said salicide precursor is reacted with said upper layer to form a salicide self-aligned to said upper layer through an annealing process.

13. An integrated method of forming a thermistor, comprising:
    forming an interlevel dielectric layer (ILD) above a first wiring level of an integrated circuit;
    forming an embossed area in said ILD;
    depositing a thermistor material in said embossed area and over said ILD;
    patterning said thermistor material;
    etching said ILD selective to said patterned thermistor material to define openings in said ILD above said first wiring level, said thermistor material serving as a hardmask during said etching;
    forming a second wiring level in said openings;
    removing said thermistor material from a surface of said ILD while permitting said thermistor material to remain in said embossed area; and
    forming contacts to said thermistor material.

14. The method of claim 13, wherein said step of forming said contacts to said remaining thermistor material includes forming a second interlevel dielectric (second ILD) above said thermistor material, forming openings in said second ILD and filling said openings with a conductor.

15. The method of claim 13, wherein said step of forming said contacts further includes forming an insulative capping layer above said remaining thermistor material prior to forming said second ILD and extending said openings through said insulative capping layer.

16. The method of claim 13, wherein said step of forming said second wiring level in said openings includes forming a conductive liner in said openings and thereafter depositing a conductor in said lined openings.

17. The method of claim 16, wherein said thermistor material is selected from the group consisting of organic polymeric materials such as various anti-reflective coatings (ARCs) used in semiconductor processing, inorganic materials such as silicon oxides, silicon nitrides, silicon oxynitrides and SiC, or any metallic or semi-conducting material in an amorphous, poly-crystalline, or single-crystal form.

18. The method of claim 13, further comprising interconnecting first and second conductive patterns to respective ones of said contacts such that said thermistor provides local interconnection between said first and second conductive patterns.

* * * * *